(12) United States Patent
Yantchev

(10) Patent No.: US 12,244,299 B2
(45) Date of Patent: *Mar. 4, 2025

(54) TRANSVERSELY-EXCITED FILM BULK ACOUSTIC RESONATOR WITH PERIODIC ETCHED HOLES

(71) Applicant: MURATA MANUFACTURING CO., LTD., Kyoto-fu (JP)

(72) Inventor: Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/417,972

(22) Filed: Jan. 19, 2024

(65) Prior Publication Data

US 2024/0186984 A1  Jun. 6, 2024

Related U.S. Application Data

(63) Continuation of application No. 17/702,549, filed on Mar. 23, 2022, now Pat. No. 11,916,540, which is a
(Continued)

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02015* (2013.01); *H03H 9/02031* (2013.01);
(Continued)

(58) Field of Classification Search
CPC ............... H03H 9/568; H03H 9/02015; H03H 9/02031; H03H 9/02062; H03H 9/02228;
(Continued)

(56) References Cited

U.S. PATENT DOCUMENTS 5,705,399 A  1/1998  Larue
5,853,601 A  12/1998  Krishaswamy et al.
(Continued)

FOREIGN PATENT DOCUMENTS

CN  1926763 A  3/2007
CN  201893487 U  7/2011
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Hafizur Rahman
(74) *Attorney, Agent, or Firm* — ARENTFOX SCHIFF LLP

(57) ABSTRACT

There are disclosed acoustic resonators and method of fabricating acoustic resonators. An acoustic resonator includes a single-crystal piezoelectric plate having front and back surfaces, the back surface attached to a surface of a substrate except for portions of the piezoelectric plate forming a diaphragm spanning a cavity in the substrate. A conductor pattern on the front surface includes an interdigital transducer (IDT) with interleaved fingers of the IDT disposed on the diaphragm. A periodic array of holes is provided in the diaphragm.

20 Claims, 9 Drawing Sheets

Related U.S. Application Data continuation of application No. 16/930,534, filed on Jul. 16, 2020, now Pat. No. 11,323,096, which is a continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192.

(60) Provisional application No. 62/874,709, filed on Jul. 16, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
    *H03H 9/13*        (2006.01)
    *H03H 9/17*        (2006.01)
    *H03H 3/02*        (2006.01)
    *H10N 30/87*      (2023.01)

(52) U.S. Cl.
    CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 3/02* (2013.01); *H03H 2003/023* (2013.01); *H03H 9/02039* (2013.01); *H10N 30/877* (2023.02)

(58) Field of Classification Search
    CPC ........ H03H 9/132; H03H 9/174; H03H 9/176; H03H 9/562; H03H 9/564; H03H 3/02; H03H 9/02039; H03H 2003/023; H10N 30/877
    USPC .......................................................... 333/192
    See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 11,916,540 B2 * | 2/2024 | Yantchev ........... H03H 9/02622 |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0234805 A1 | 8/2015 | Caswell |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |

(56) References Cited

U.S. PATENT DOCUMENTS

| | | |
|---|---|---|
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |
| 2020/0021272 A1 | 1/2020 | Segovia Fernandez et al. |
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar, 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana—Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. 1, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband

(56) References Cited

OTHER PUBLICATIONS

Filtering", IEEE Transactions on Microwave Theory and Techniques, vol. 61, No. 1, Jan. 2013, pp. 403-413.

* cited by examiner

TRANSVERSELY-EXCITED FILM BULK ACOUSTIC RESONATOR WITH PERIODIC ETCHED HOLES

CROSS REFERENCE TO RELATED APPLICATIONS

This patent application is a continuation of U.S. patent application Ser. No. 17/702,549, filed Mar. 23, 2022, which is a continuation of U.S. patent application Ser. No. 16/930,534, filed Jul. 16, 2020, now issued as U.S. Pat. No. 11,323,096, which claims priority from provisional U.S. Patent Application No. 62/874,709, filed Jul. 16, 2019, entitled XBAR WITH SLANTED AND/OR PERFORATED MEMBRANE.

U.S. patent application Ser. No. 16/930,534 is also a continuation-in-part of U.S. patent application Ser. No. 16/689,707, filed Nov. 20, 2019, now issued as U.S. Pat. No. 10,917,070, which is a continuation of U.S. patent application Ser. No. 16/230,443, filed Dec. 21, 2018, now U.S. Pat. No. 10,491,192, issued Nov. 26, 2019, which claims priority from the following provisional patent applications: U.S. Patent Application No. 62/685,825, filed Jun. 15, 2018, entitled SHEAR-MODE FBAR (XBAR); U.S. Patent Application No. 62/701,363, filed Jul. 20, 2018, entitled SHEAR-MODE FBAR (XBAR); U.S. Patent Application No. 62/741,702, filed Oct. 5, 2018, entitled 5 GHZ LATERALLY-EXCITED BULK WAVE RESONATOR (XBAR); U.S. Patent Application No. 62/748,883, filed Oct. 22, 2018, entitled SHEAR-MODE FILM BULK ACOUSTIC RESONATOR, and U.S. Patent Application No. 62/753,815, filed Oct. 31, 2018, entitled LITHIUM TANTALATE SHEAR-MODE FILM BULK ACOUSTIC RESONATOR. All of these applications are incorporated herein by reference in the entireties.

TECHNICAL FIELD

This disclosure relates to radio frequency filters using acoustic wave resonators, and specifically to bandpass filters with high power capability for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size, and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
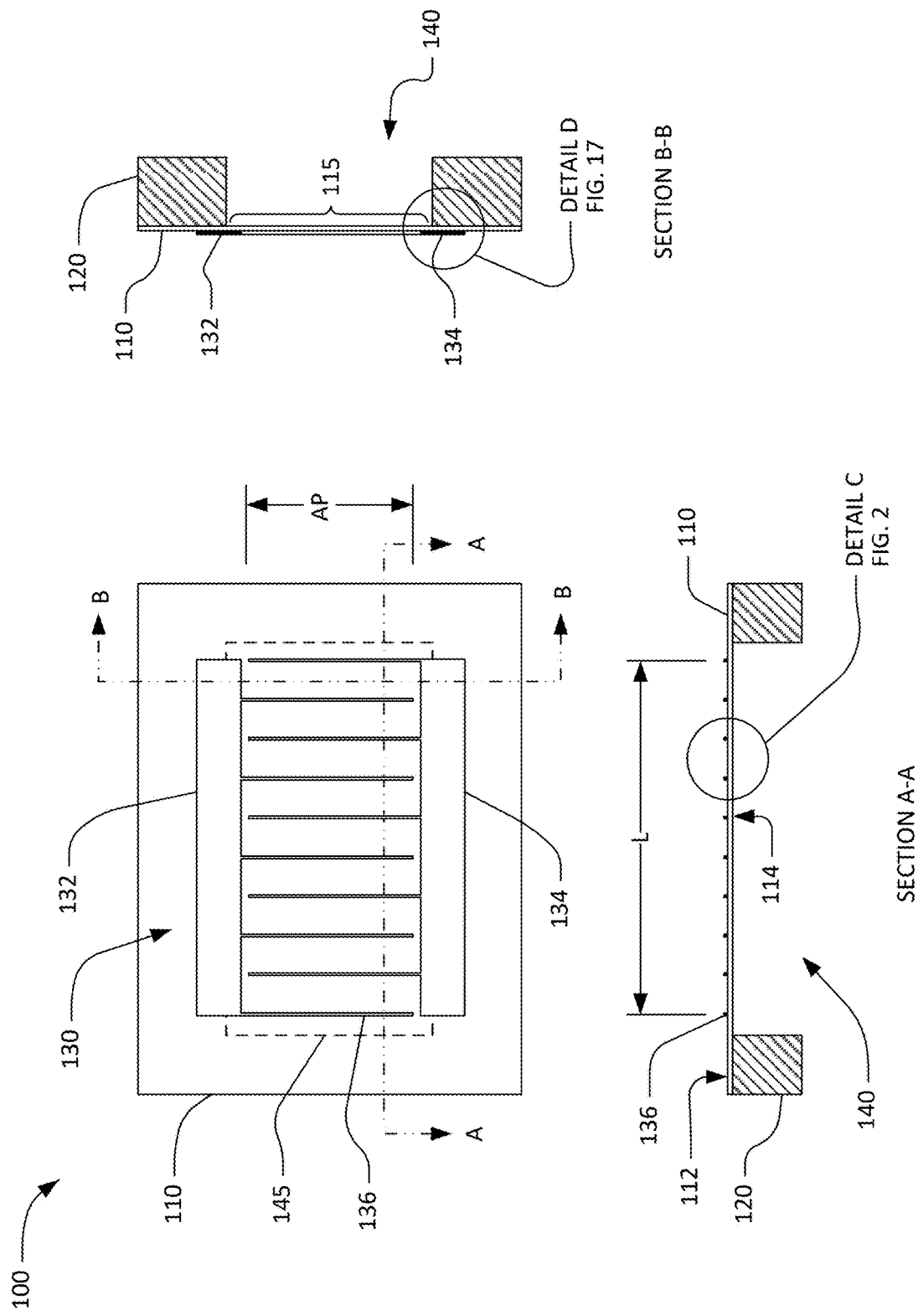
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate are at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
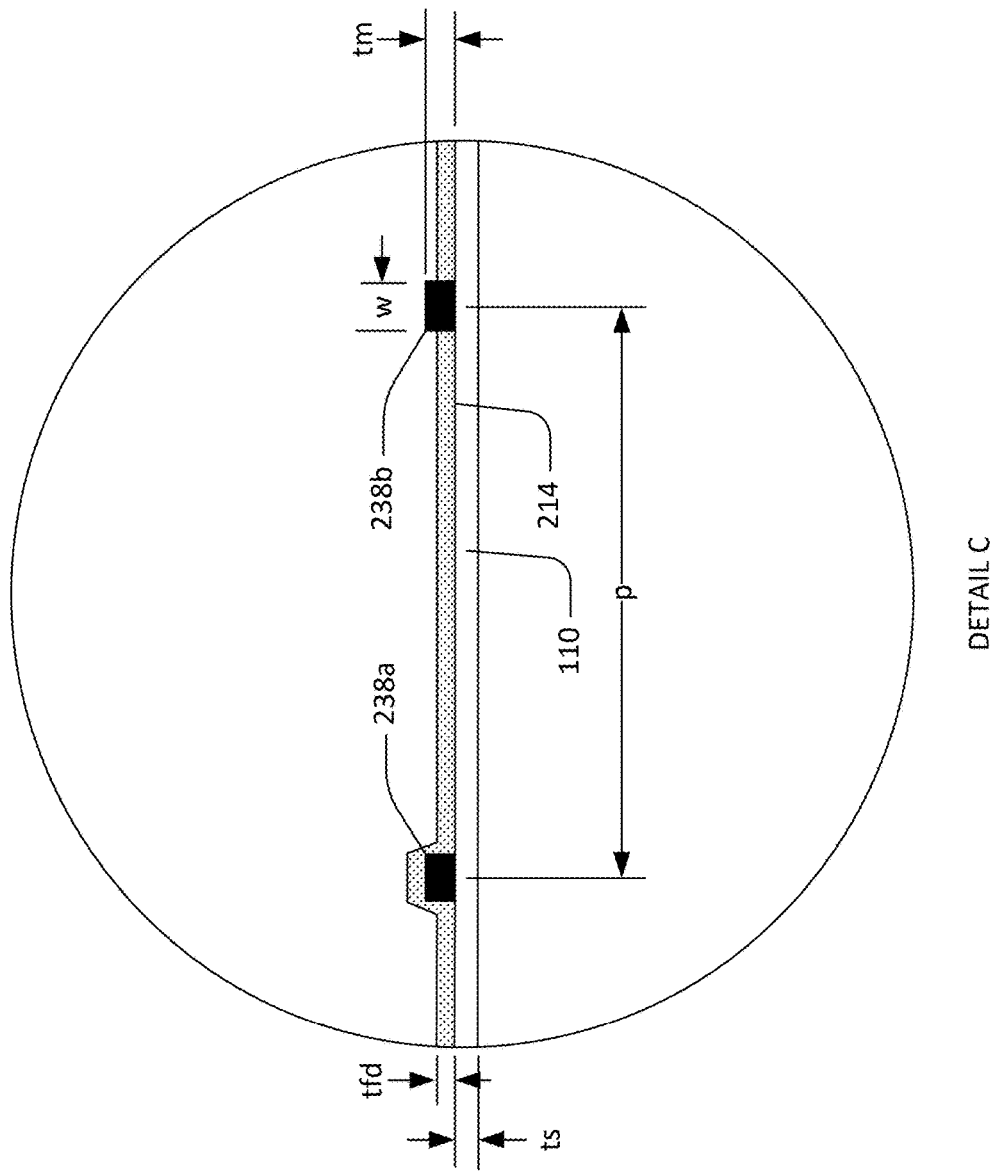
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTET bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 may be formed only between the IDT fingers (e.g. IDT finger 238b) or may be deposited as a blanket layer such that the dielectric layer is formed both between and over the IDT fingers (e.g. IDT finger 238a). The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials.

The IDT fingers 238a and 238b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 110. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
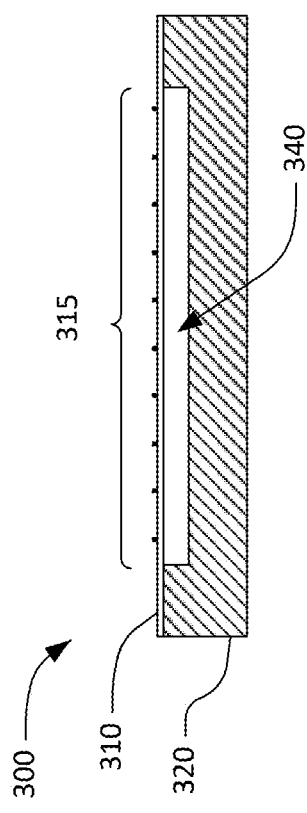
FIG. 3A is an alternative schematic cross-sectional view of the XBAR of FIG. 1.
Figure 3B:
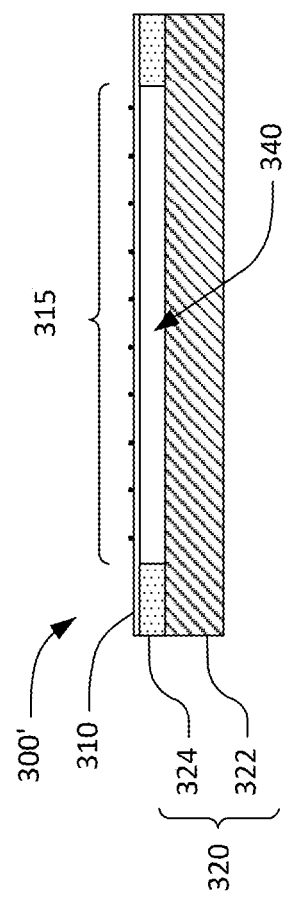
FIG. 3B is another alternative schematic cross-sectional view of the XBAR of FIG. 1.

FIG. 3A and FIG. 3B show two alternative cross-sectional views along the section plane A-A defined in FIG. 1. In FIG. 3A, a resonator 300 includes a piezoelectric plate 310 attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340. An intermediate layer (not shown), such as a dielectric bonding layer, may be present between the piezoelectric plate 310 and the substrate 320.

In FIG. 3B, a resonator 300' includes a piezoelectric plate 310 attached to a substrate 320. The substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A portion of the piezoelectric plate 310 forms a diaphragm 315 spanning a cavity 340 in the intermediate layer 324. Fingers of an IDT are disposed on the diaphragm 315. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340 as shown in FIG. 3B. Although not shown in FIG. 3B, a cavity formed in the intermediate layer 324 may extend into the base 322.

Figure 4:
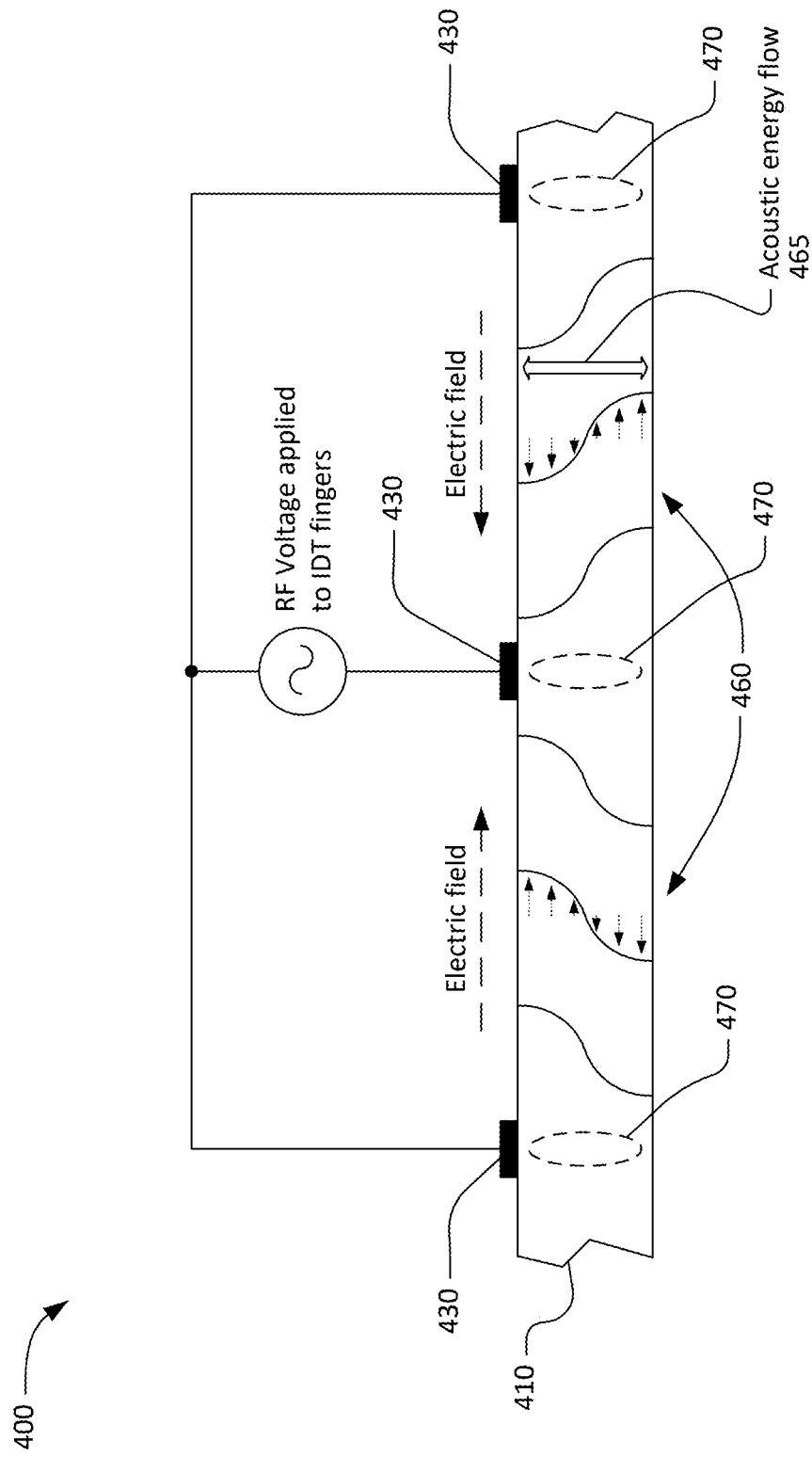
FIG. 4 is a graphic illustrating a primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 which alternate in electrical polarity from finger to finger. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 410. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and relative magnitude of atomic motion at the resonance frequency. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary acoustic mode is substantially orthogonal to the surface of the piezoelectric plate, as indicated by the arrow 465.

Considering FIG. 4, there is essentially no RF electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator) for the primary acoustic mode, which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
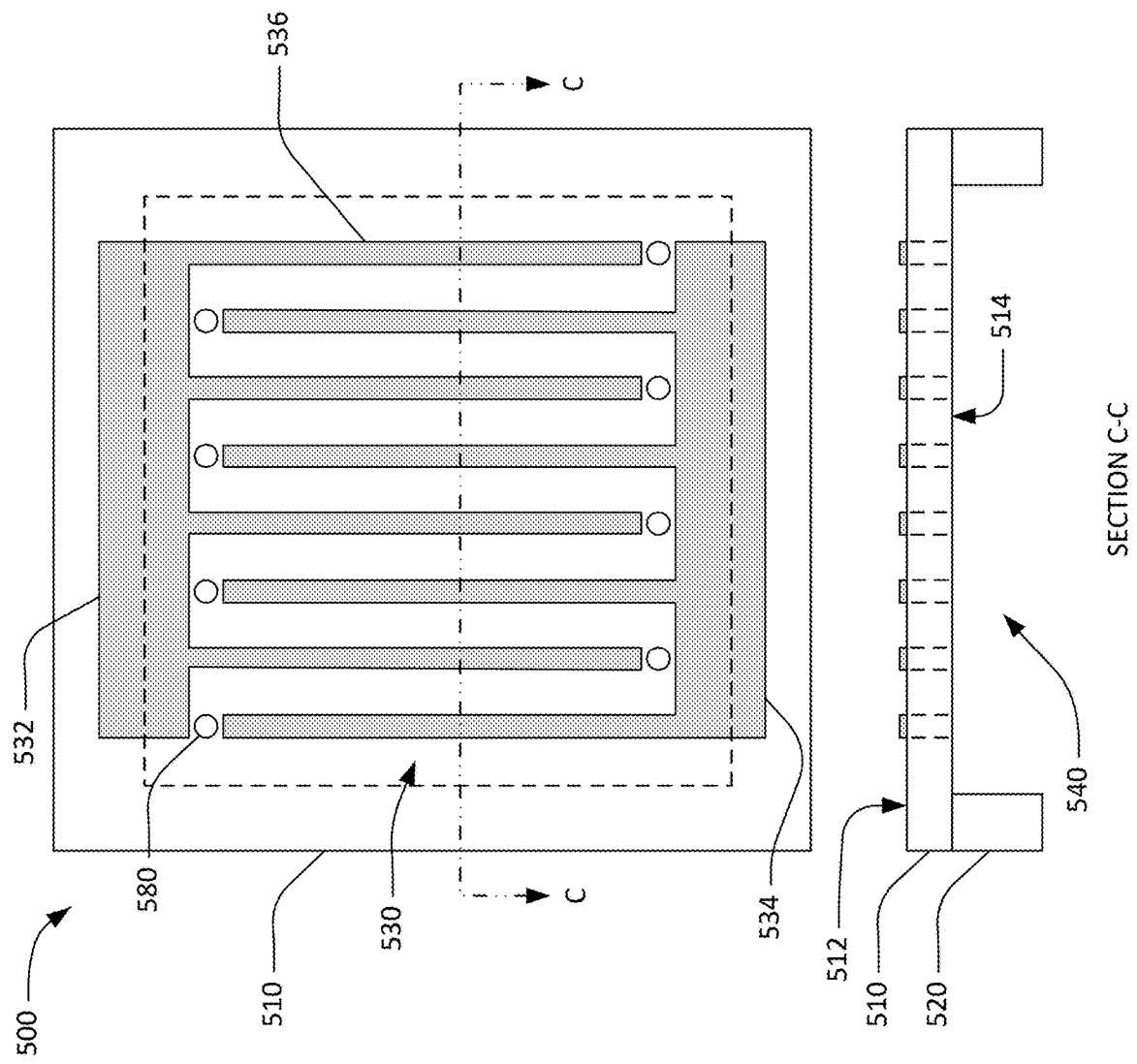
FIG. 5 is a plan view of an XBAR with periodic etched holes.

FIG. 5 is a plan view of an XBAR 500 with periodic etched holes. The XBAR 500 includes a piezoelectric plate 510 having parallel front and back surfaces 512, 514, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent.

The back surface 514 of the piezoelectric plate is attached to surface of a substrate 520. A portion of the piezoelectric plate forms a diaphragm spanning a cavity 540 in the substrate 520. As shown in FIG. 5, the cavity 540 extends completely through the substrate 520. The cavity may only extend part way through the substrate, as shown in FIG. 3A and FIG. 3B.

An IDT 530 is formed on the surface of the piezoelectric plate 510. The IDT 530 includes a first busbar 532 and a second busbar 534. A first set of parallel fingers, such as finger 536 extends from the first busbar 532. A second set of parallel fingers extends from the second busbar 534. The first and second sets of fingers are parallel and interleaved. At least the interleaved fingers of the IDT are disposed on the diaphragm. A periodic array of holes 580 are formed in the diaphragm. As shown in FIG. 5, the periodic array includes one hole at the end of each IDT finger. Specifically, a hole is disposed between the end of each of the first set of fingers and the second busbar and a hole is disposed between the end of each of the second set of fingers and the first busbar. Other periodic arrangements of the holes, such as at the ends of alternate IDT fingers may be used.

The periodic array of holes 580 has two effects on the performance of the XBAR 500. First, the holes scatter, and thus inhibit resonance of, spurious acoustic waves traveling parallel to the IDT fingers. Such spurious acoustic waves can introduce ripple in the input/output transfer function of XBAR filters. Second, the array of holes 580 appears to increase the Q-factor of XBAR devices, possibly by helping to confine the primary shear acoustic mode to the aperture of the XBAR.

As shown in FIG. 5, the holes 580 are right circular cylinders with a diameter approximately equal to the width of the IDT fingers. The size and shape of the holes in FIG. 5 is exemplary. The holes may be larger or smaller than the width of the IDT fingers and may have a cross-sectional shape other than circular. For example, the cross-sectional shape of the holes may be oval, square, rectangular, or some other shape. The holes need not necessarily pass through the piezoelectric plate. The holes may be blind holes that only extend part way though the thickness of the piezoelectric plate. The size and depth of the holes must be sufficient to create a domain with significantly reduced acoustic impedance. An additional benefit of holes at the ends of the IDT fingers is reduction of parasitic capacitance between the IDT finger tips and the adjacent busbar.

Figure 6:
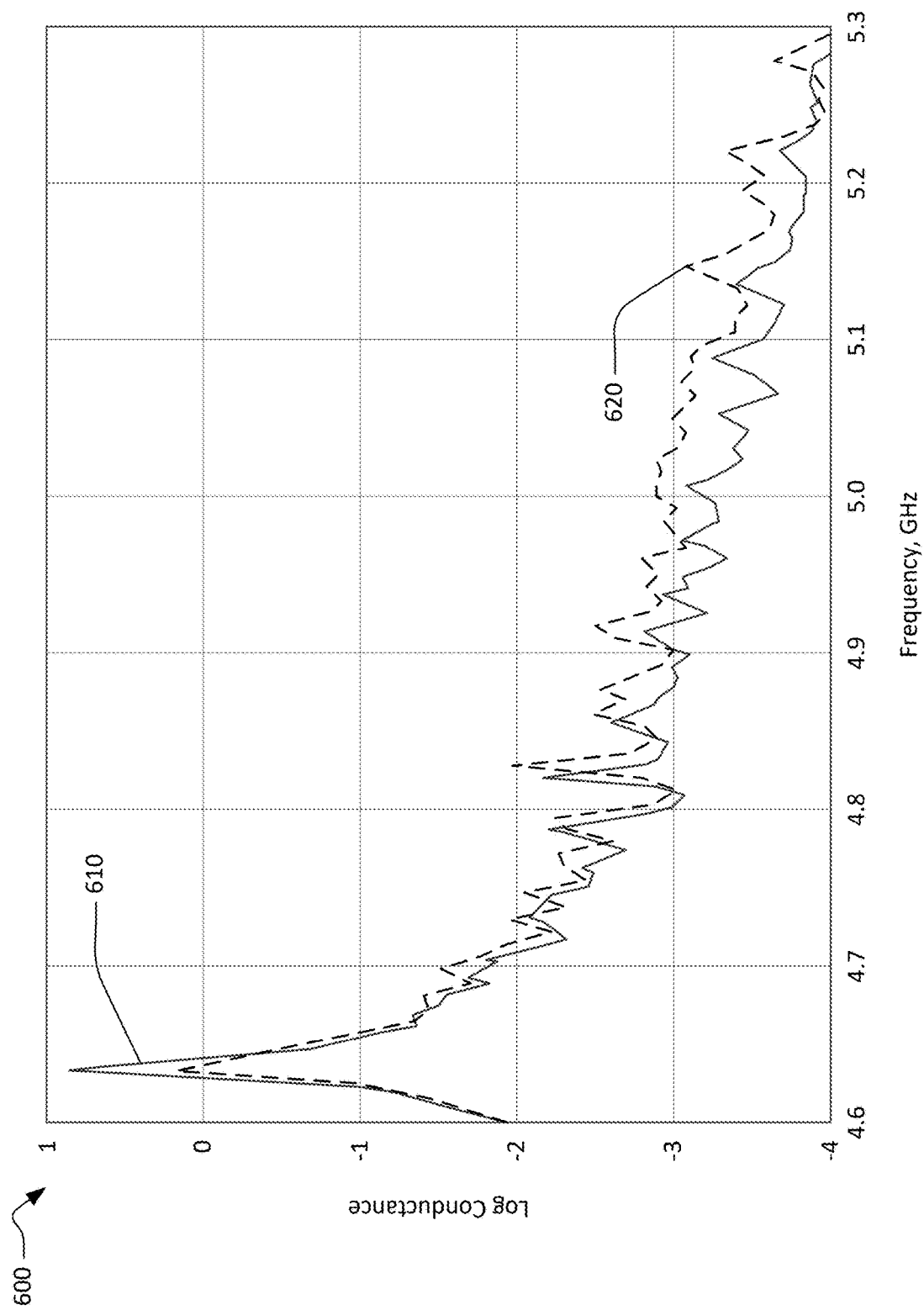
FIG. 6 is a graph of the conductance versus frequency for XBARs with and without periodic etched holes.

FIG. 6 is a graph of the conductance versus frequency for XBARs with and without periodic etched holes. The conductance was determined by 3-dimensional simulation using a finite element technique. The solid line 610 is the conductance (on a logarithmic scale) of an XBAR with holes at the end of each IDT finger, as shown in FIG. 5. The dashed line 620 is the conductance of a similar XBAR without holes. The improvement in the Q-factor is evident in the higher, sharper conductance peak to the resonance frequency of 4.64 GHz. Above the resonance frequency, local variations, or ripple, in conductance are reduced, but not eliminated, by the presence of the array of holes.

Figure 7:
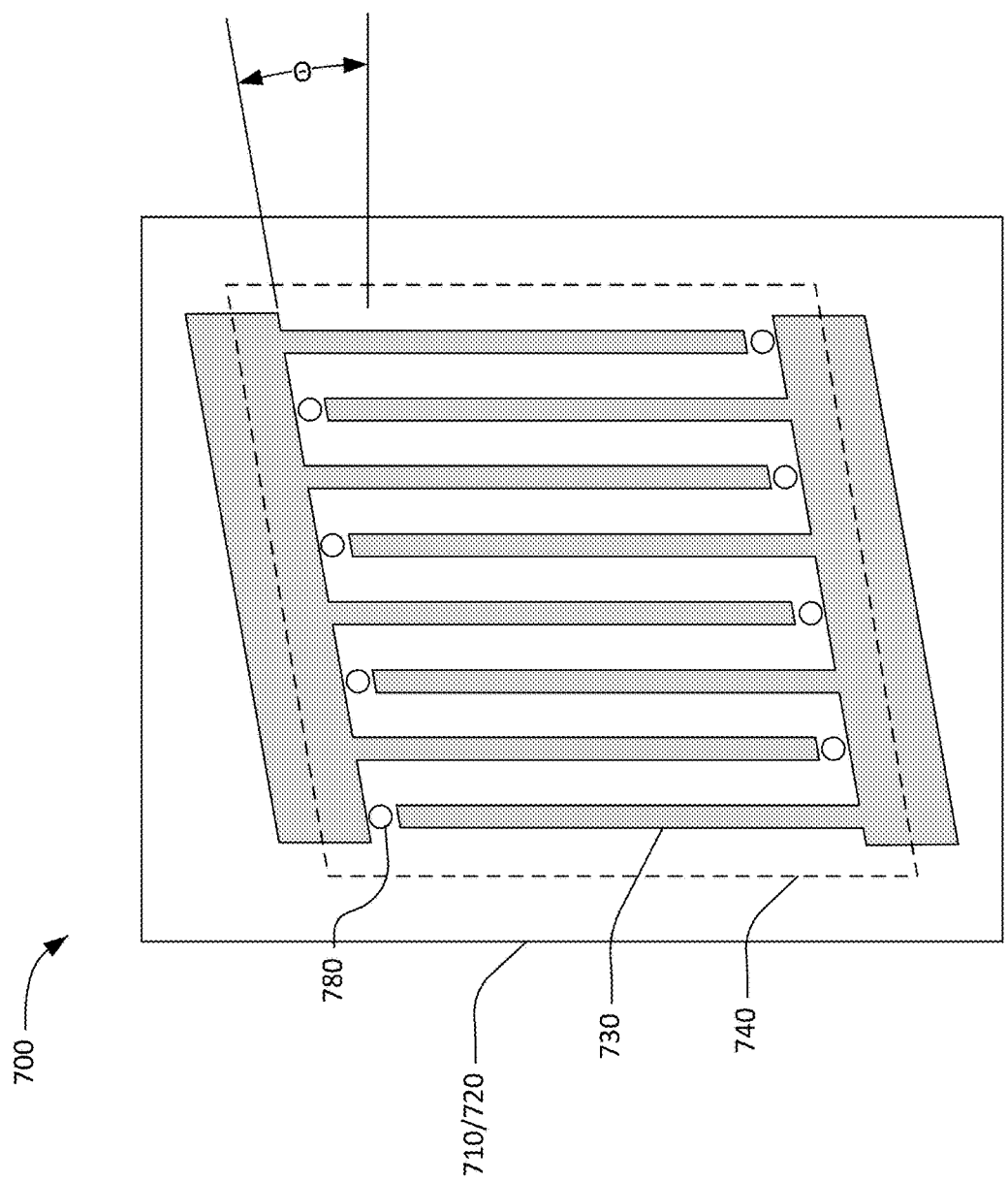
FIG. 7 is a plan view of another interdigital transducer with periodic etched holes.

FIG. 7 is a plan view of another XBAR 700 with periodic array of etched holes. The XBAR 700 includes a piezoelectric plate 710, a substrate 720 (not visible beneath the piezoelectric plate), an IDT 730, and a cavity 740. Each of these elements is comparable to the corresponding element of the XBAR 500 of FIG. 5, except that the upper and lower (as seen in the figure) edges of the cavity and the busbars of the IDT are not perpendicular to the IDT fingers. Specifically, the upper and lower edges of the cavity and the busbars are inclined by an angle θ with respect to a line perpendicular to the IDT fingers. The angle θ may be between 0 and 25 degrees for example.

Figure 8:
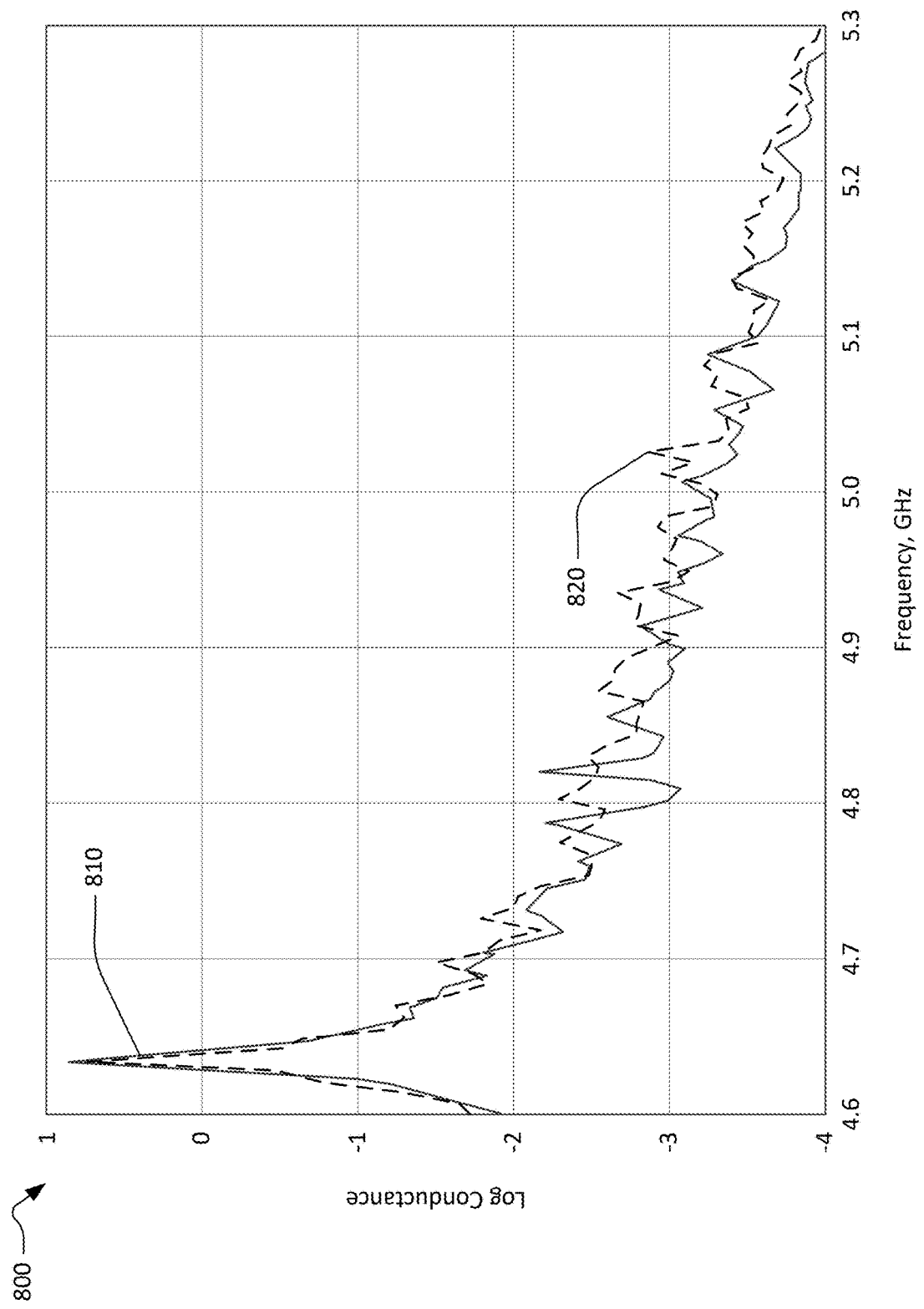
FIG. 8 is a graph of the conductance versus frequency for XBARs with and without periodic etched holes.

FIG. 8 is a graph of the conductance versus frequency for two XBARs with periodic etched holes. The conductance was determined by 3-dimensional simulation using a finite element technique. The solid line 810 is the conductance (on a logarithmic scale) of an XBAR with holes at the end of each IDT finger, as shown in FIG. 5. The dashed line 820 is the conductance of an XBAR with the busbars and upper and lower edges of the cavity not perpendicular to the IDT fingers and holes at the end of each IDT finger, as shown in FIG. 7. The Q-factors of the two XBARs at the resonance frequency are comparable Above the resonance frequency, local variations, or ripple, in conductance are further reduced in the device with the busbars and upper and lower edges of the cavity not perpendicular to the IDT fingers.

Description of Methods

Figure 9:
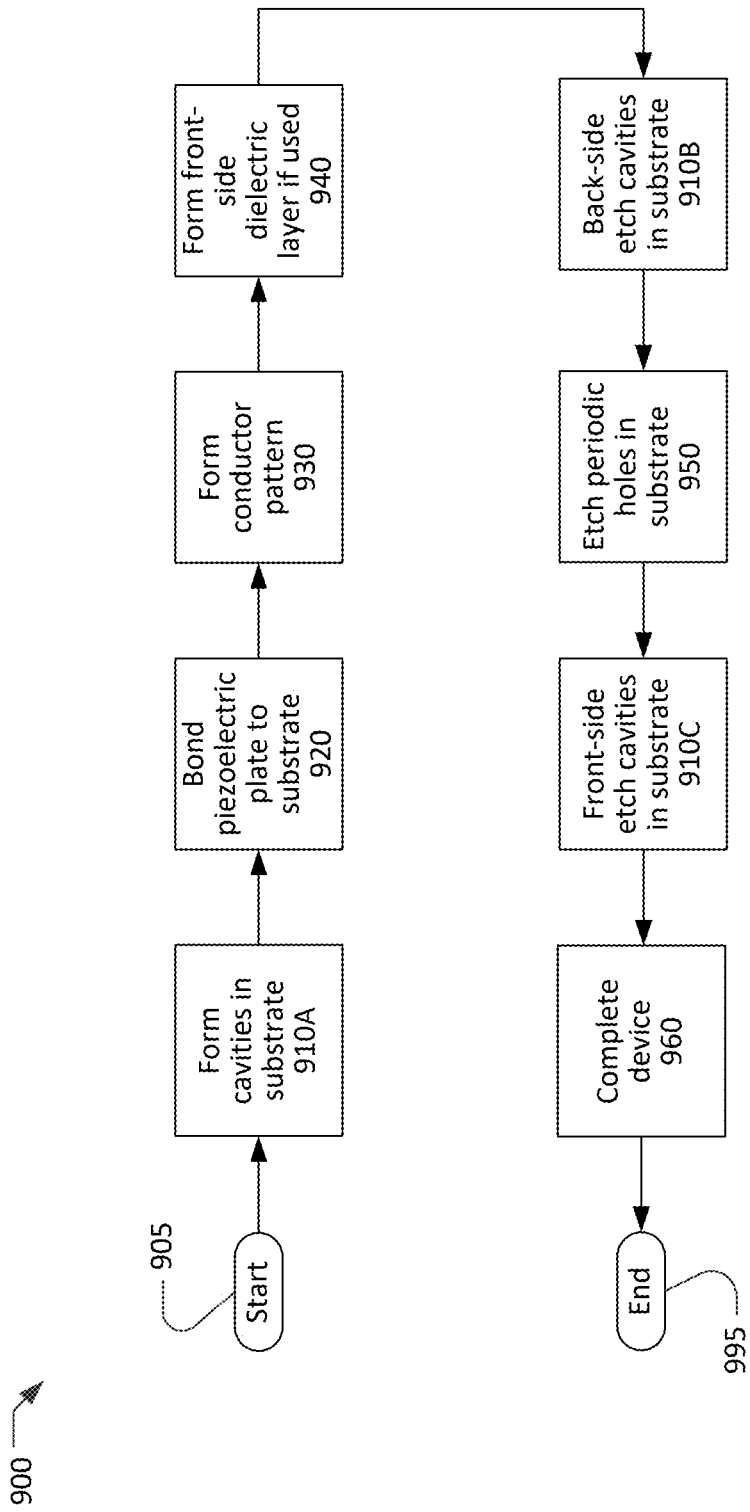
FIG. 9 is a flow chart of a process for fabricating an XBAR with periodic etched holes.

FIG. 9 is a simplified flow chart showing a process 900 for making an XBAR or a filter incorporating XBARs. The process 900 starts at 905 with a substrate and a plate of piezoelectric material and ends at 995 with a completed XBAR or filter. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

The flow chart of FIG. 9 captures three variations of the process 900 for making an XBAR which differ in when and how cavities are formed in the substrate. The cavities may be formed at steps 910A, 910B, or 910C. Only one of these steps is performed in each of the three variations of the process 900.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 900, one or more cavities are formed in the substrate at 910A, before the piezoelectric plate is bonded to the substrate at 920. A separate cavity may be formed for each resonator in a filter device. The one or more cavities may be formed using conventional photolithographic and etching techniques. Typically, the cavities formed at 910A will not penetrate through the substrate, and the resulting resonator devices will have a cross-section as shown in FIG. 3A or FIG. 3B.

At 920, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 930 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 930 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 930 using a lift-off process. Photoresist may be deposited over the piezoelectric plate, and patterned to define the conductor pattern. The conductor layer and, optionally, one or more other layers may be deposited in sequence over the surface of the piezoelectric plate. The photoresist may then be removed, which removes the excess material, leaving the conductor pattern.

At 940, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 900, one or more cavities are formed in the back side of the substrate at 910B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

At 950, periodic holes, as shown in FIG. 5 and FIG. 7, may be formed. The periodic holes may extend part way or completely through the piezoelectric plate and the front-side dielectric layer, if present. For example, the positions of the holes may be defined photolithographically and the holes may be formed using a suitable wet or dry etching process.

In a third variation of the process 900, one or more cavities in the form of recesses in the substrate may be formed at 910C by etching the substrate using an etchant introduced through openings in the piezoelectric plate. The periodic holes formed at 950 may serve as the openings through which the etchant is introduced. A separate cavity may be formed for each resonator in a filter device. The one or more cavities formed at 910C will not penetrate through the substrate, and the resulting resonator devices will have a cross-section as shown in FIG. 3A or FIG. 3B.

In all variations of the process 900, the filter device is completed at 960. Actions that may occur at 960 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 960 is to tune the resonant frequencies of the resonators within the device by adding or removing metal or dielectric material from the front side of the device. After the filter device is completed, the process ends at 995.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:
1. An acoustic resonator, comprising:
a substrate;
a dielectric layer disposed on the substrate and having a cavity disposed therein;
a piezoelectric layer disposed above the dielectric layer and including a diaphragm over the cavity in the dielectric layer;

a conductor pattern at the piezoelectric layer and including an interdigital transducer (IDT) having a plurality of interleaved fingers on the diaphragm; and at least one hole extending in the diaphragm at an end of at least one finger of the plurality of interleaved fingers of the IDT.

2. The acoustic resonator of claim 1, wherein the at least one hole comprises a periodic array of holes in the diaphragm at respective ends of the plurality of interleaved fingers.

3. The acoustic resonator of claim 1, wherein the piezoelectric layer and the IDT are configured such that a radio frequency signal applied to the IDT excites a primarily shear acoustic mode in the diaphragm.

4. The acoustic resonator of claim 1, wherein the at least one hole is one of:
a circular cylinder with a diameter approximately equal to a width of the at least one finger, or
a hole having a cross-sectional shape that is not circular.

5. The acoustic resonator of claim 1, wherein the at least one hole comprises a periodic array of holes including one hole proximate a respective end of every other interleaved finger of the IDT.

6. The acoustic resonator of claim 1,
wherein the IDT comprises first and second busbars that oppose each other, a first set of fingers extending from the first busbar, and a second set of fingers extending from the second busbar, and
wherein the at least one hole comprises a plurality of holes including a hole between an end of each alternate finger of the first set of fingers and the second busbar, and a hole between an end of each alternate finger of the second set of fingers and the first busbar.

7. The acoustic resonator of claim 1, wherein the at least one hole extends entirely through the diaphragm of the piezoelectric layer.

8. The acoustic resonator of claim 1, wherein the at least one hole is a blind hole that does not extend entirely through the diaphragm.

9. An acoustic resonator, comprising:
a piezoelectric layer;
a conductor pattern at the piezoelectric layer and including an interdigital transducer (IDT) having a plurality of interleaved fingers thereon; and
at least one hole extending in the piezoelectric layer at an end of at least one finger of the plurality of interleaved fingers of the IDT.

10. The acoustic resonator of claim 9, further comprising:
a substrate; and
a dielectric layer disposed on the substrate and having a cavity disposed therein,
wherein the piezoelectric layer includes a diaphragm over the cavity in the dielectric layer and the plurality of interleaved fingers of the IDT extend on the diaphragm.

11. The acoustic resonator of claim 9, wherein the at least one hole comprises a periodic array of holes in the piezoelectric layer at respective ends of the plurality of interleaved fingers.

12. The acoustic resonator of claim 9, wherein the piezoelectric layer and the IDT are configured such that a radio frequency signal applied to the IDT excites a primarily shear acoustic mode in the piezoelectric layer.

13. The acoustic resonator of claim 9, wherein the at least one hole is one of:
a circular cylinder with a diameter approximately equal to a width of the at least one finger, or
a hole having a cross-sectional shape that is not circular.

14. The acoustic resonator of claim 9, wherein the at least one hole comprises a periodic array of holes including one hole proximate a respective end of every other interleaved finger of the IDT.

15. The acoustic resonator of claim 9,
wherein the IDT comprises first and second busbars that oppose each other, a first set of fingers extending from the first busbar, and a second set of fingers extending from the second busbar, and
wherein the at least one hole comprises a plurality of holes including a hole between an end of each alternate finger of the first set of fingers and the second busbar, and a hole between an end of each alternate finger of the second set of fingers and the first busbar.

16. The acoustic resonator of claim 9, wherein the at least one hole extends entirely through the piezoelectric layer.

17. The acoustic resonator of claim 9, wherein the at least one hole is a blind hole that does not extend entirely through the piezoelectric layer.

18. A filter device comprising:
a plurality of acoustic resonators, with at least one acoustic resonator of the plurality of acoustic resonators comprising:
a substrate,
a piezoelectric layer attached to the substrate either directly or via one or more intermediate layers and including a diaphragm over a cavity,
a conductor pattern at the piezoelectric layer and including an interdigital transducer (IDT) having a plurality of interleaved fingers on the diaphragm, and
at least one hole extending in the diaphragm at an end of at least one finger of the plurality of interleaved fingers of the IDT.

19. The filter device of claim 18,
wherein the IDT comprises first and second busbars that oppose each other, a first set of fingers extending from the first busbar, and a second set of fingers extending from the second busbar, and
wherein the first and second busbars are inclined by an angle θ with respect to a direction perpendicular to the plurality of interleaved fingers, the angle θ being greater than 0 and less than or equal to 25 degrees.

20. The filter device of claim 18, wherein, for the at least one acoustic resonator of the plurality of acoustic resonators, the piezoelectric layer and the IDT are configured such that a radio frequency signal applied to the IDT excites a primarily shear acoustic mode in the piezoelectric layer.

* * * * *